United States Patent
Huang et al.

(10) Patent No.: US 10,353,280 B2
(45) Date of Patent: Jul. 16, 2019

(54) OPTICALLY ENHANCED SOLID-STATE LIGHT CONVERTERS

(71) Applicant: Materion Corporation, Mayfield Heights, OH (US)

(72) Inventors: Yuyong Huang, Shanghai (CN); Simon Cao, Shanghai (CN)

(73) Assignee: MATERION CORPORATION, Mayfield Heights, OH (US)

( * ) Notice: Subject to any disclaimer, the term of this patent is extended or adjusted under 35 U.S.C. 154(b) by 0 days.

(21) Appl. No.: 15/549,561

(22) PCT Filed: Apr. 7, 2015

(86) PCT No.: PCT/CN2015/075996
§ 371 (c)(1),
(2) Date: Aug. 8, 2017

(87) PCT Pub. No.: WO2016/161557
PCT Pub. Date: Oct. 13, 2016

(65) Prior Publication Data
US 2018/0059522 A1 Mar. 1, 2018

(51) Int. Cl.
*C09K 11/02* (2006.01)
*C09K 11/08* (2006.01)
(Continued)

(52) U.S. Cl.
CPC ............ *G03B 21/204* (2013.01); *C09K 11/02* (2013.01); *C09K 11/08* (2013.01); *G02B 26/008* (2013.01); *H01L 27/142* (2013.01)

(58) Field of Classification Search
CPC ..... H01L 33/50; H01L 33/502; H01L 33/504; H01L 33/58–60; H01L 2933/0041; H01L 2933/0025; H01L 2933/0058
See application file for complete search history.

(56) References Cited

U.S. PATENT DOCUMENTS 6,541,788 B2    4/2003  Petroff et al.
2003/0178618 A1*  9/2003  Murakami .......... H01L 27/1462
                                                    257/21
(Continued)

FOREIGN PATENT DOCUMENTS

CN    101127379 A    2/2008
CN    101539270 A    9/2009
(Continued)

OTHER PUBLICATIONS

International Search Report from PCT/CN2015/075996, dated Dec. 31, 2015.
(Continued)

*Primary Examiner* — Moazzam Hossain
*Assistant Examiner* — Stanetta D Isaac
(74) *Attorney, Agent, or Firm* — Fay Sharpe LLP

(57) ABSTRACT

A light converter (200) comprises: a solid-state light conversion material (201) that generates emission light from excitation light incident on its surface; a filler layer (230, 240) on the surface of the solid-state light conversion material (201); and an optical coating (220, 250) on the filler layer. The optical coating (220, 250) may be a thin film, such as an anti-reflective coating (220) and/or a high-reflective coating (250). A metallic coating (260) may additionally be provided. The light converter (200) may be used for an optical device, such as a phosphor wheel or automotive headlight.

14 Claims, 4 Drawing Sheets

(51) Int. Cl.
*G02B 26/00* (2006.01)
*G03B 21/20* (2006.01)
*H01L 27/142* (2014.01)

(56) References Cited

U.S. PATENT DOCUMENTS

| | | | |
|---|---|---|---|
| 2012/0068213 A1* | 3/2012 | Zhang | B32B 18/00 |
| | | | 257/98 |
| 2013/0098438 A1* | 4/2013 | Kawai | H01L 31/055 |
| | | | 136/256 |
| 2013/0250544 A1 | 9/2013 | Zink et al. | |
| 2013/0257264 A1 | 10/2013 | Tamaki et al. | |
| 2014/0226335 A1 | 8/2014 | Menkara | |

FOREIGN PATENT DOCUMENTS

| | | |
|---|---|---|
| CN | 102246064 A | 11/2011 |
| CN | 103703414 A | 4/2014 |
| CN | 104205373 A | 12/2014 |
| EP | 2360523 A1 | 8/2011 |
| JP | 2012036367 A | 2/2012 |
| JP | 2012185980 A | 9/2012 |
| JP | 2013130605 A | 7/2013 |
| TW | 200807135 A | 2/2008 |
| TW | 201415155 A | 4/2014 |
| WO | WO 2013024246 A1 | 2/2013 |
| WO | WO 2014016574 A1 | 1/2014 |
| WO | WO 2014135041 A1 | 9/2014 |

OTHER PUBLICATIONS

Taiwan Search Report for Taiwan Application No. 104112932 dated Aug. 14, 2018.

Supplementary European Search Report for European Application No. EP 15888114 dated Sep. 25, 2018.

* cited by examiner

Fig. 1 – PRIOR ART

OPTICALLY ENHANCED SOLID-STATE LIGHT CONVERTERS

This application is a 371 of PCT Patent Application Serial No. PCT/CN2015/075996, filed Apr. 5, 2015.

TECHNICAL FIELD OF THE INVENTION

The present invention relates to a light converter comprising a solid-state light conversion material, which may form part of an optical device such as a phosphor wheel. A method of manufacturing a light converter is also provided.

BACKGROUND TO THE INVENTION

Light conversion (or wavelength conversion) materials such as phosphors are used in a variety of applications, especially in optical devices. One such application is a phosphor wheel, which is an optical device for generating emission light of one or typically multiple different wavelengths from excitation light of a single light source (typically of a narrow range of wavelengths). An example phosphor wheel is described in WO-2014/016574, having common inventorship.

An example, known phosphor wheel structure is shown in FIG. 1. A light converter 101 is provided on a disc substrate 102. Excitation light 103a (source light) causes the generation of emission light 103b, when it is incident on the light converter 101. The light converter 101 converts the light spectrum from excitation light of a first range of spectral wavelength to emission (or re-emission) light of a second, different range of spectral wavelengths Typically, the disc substrate 102 is rotated during use, although this device can be used in a static (non-rotating) configuration, in which case it may not be known as a phosphor wheel. The light converter 101 is conventionally formed as a coating, comprising phosphor particles in a polymer binder (such as a silicone).

Optical devices, especially phosphor wheels, that can cope with higher power incident light are being developed, for example for use in high-power laser projectors where the laser power may be greater than 50 W/mm$^2$. To cope with this high power light, a solid-state light conversion material is being considered, such as a ceramic converter. In addition to wavelength conversion, the ceramic converter can be coated (normally directly) with thin-films for improved optical performance. This is a significant advantage over the previous light converters made of a phosphor in a polymer binder.

However, there are challenges in using such ceramic materials. Firstly, it is desirable to optimise the optical coating so as to enhance the transmission of the excitation light and/or emission light. Anti-reflective coatings are typically used dealing with excitation light, whereas high-reflective coatings can improve emission light output. The ceramic material should be able to handle both, as well as other types of coating, such as metallic coating, which may be used to create a reflective surface. Also, the thermal dissipation of the ceramic material should be considered, to avoid over-heating. Adapting the ceramic coating to all of these issues, so as to enhance the performance of the ceramic light converter, is a significant concern.

SUMMARY OF THE INVENTION

Against this background, there is provided a light converter in accordance with claim 1. There is also provided a method of manufacturing a light converter in line with claim 14. Other preferred features are disclosed with reference to the claims and in the description below.

A filler layer is provided between the surface of a solid-state light conversion material, such as a ceramic or opto-ceramic material (a ceramic phosphor), and an optical coating (which may be part of the filler layer). During manufacture, the filler layer may be deposited before the coating. It has been recognised that solid-state light conversion material, especially ceramic converters do not necessarily have an optical surface. Rather, they may be porous and polishing does not help. Such porosity may partially or fully disable the function of any optical coatings, particularly (interference) thin-film coatings. The filler layer, especially its thickness, may be configured to be optically smooth in microscopic dimensions. Typically the filler layer has a low optical refractive index, especially low in comparison with the solid-state light conversion material. Less preferably, an optical coating having a low optical refractive index may be alternatively applied to the filler layer.

The optical coating may comprise one or more of: an anti-reflective coating; a high-reflective coating; a metallic coating. The optical coating may be applied by deposition. A single or multilayer anti-reflective (AR) coating may be applied for low reflection loss and/or high extraction of converted light. It may difficult to apply this coating directly to the solid-state light conversion material. Providing the filler layer between the solid-state light conversion material and the AR coating may mitigate such issues and allow large extraction of converted light.

Additionally or alternatively, it is desirable to collect and utilise the converted light (in the incident light direction) for better efficacy. One or multiple high-reflective (HR) coating (also called mirror coatings) may be used to achieve this by reflecting converted light. However, it has further been appreciated that since such converted light is generally isotropic and random polarized, this may present challenges for the design of the HR thin-film coating, which may be very close to the emitted light. Providing the filler layer between the solid-state light conversion material and the HR coating may further alleviate these problems. The HR coating may have a wide-angle of incidence, because of the close proximity between the light emission center and the reflective surface, which may typically be only around 100 μm or less. This may be termed a near-field coating. The combination of the low refractive index layer (preferably the filler layer) and HR coating may reflect light of large angles of incidence (at least 30, 40 or 45 degrees relative a normal to the surface) by Total Internal Reflection (TIR). Additionally or alternatively, a metallic mirror coating can be used (Ag-based such as SilFlex™, Al-based such as AlFlex™ to allow collection of emission light at large angles. The HR coating is advantageously broad-band. The HR and AR coatings may be applied to opposite surfaces of the solid-state light conversion material.

A further issue identified by the inventors relates to the thermal dissipation capability of the solid-state light conversion material. Improving this may be desirable to minimize the thermal quenching of the converter. A metallic coating may be applied (optionally on another coating). This may reduce leak of emission light at a large angle to the surface of the solid-state light conversion material.

The light converter may be provided on a substrate, such as a disc. A metallic coating on the light converter may be used to bond it to the substrate. The light converter may form part of an optical device, such as a colour wheel, a phosphor wheel for use in a projection display for example, or an automotive headlight.

BRIEF DESCRIPTION OF THE DRAWINGS

The invention may be put into practice in a number of ways, and preferred embodiments will now be described by way of example only and with reference to the accompanying drawings, in which.

DETAILED DESCRIPTION OF PREFERRED EMBODIMENTS

Figure 1:
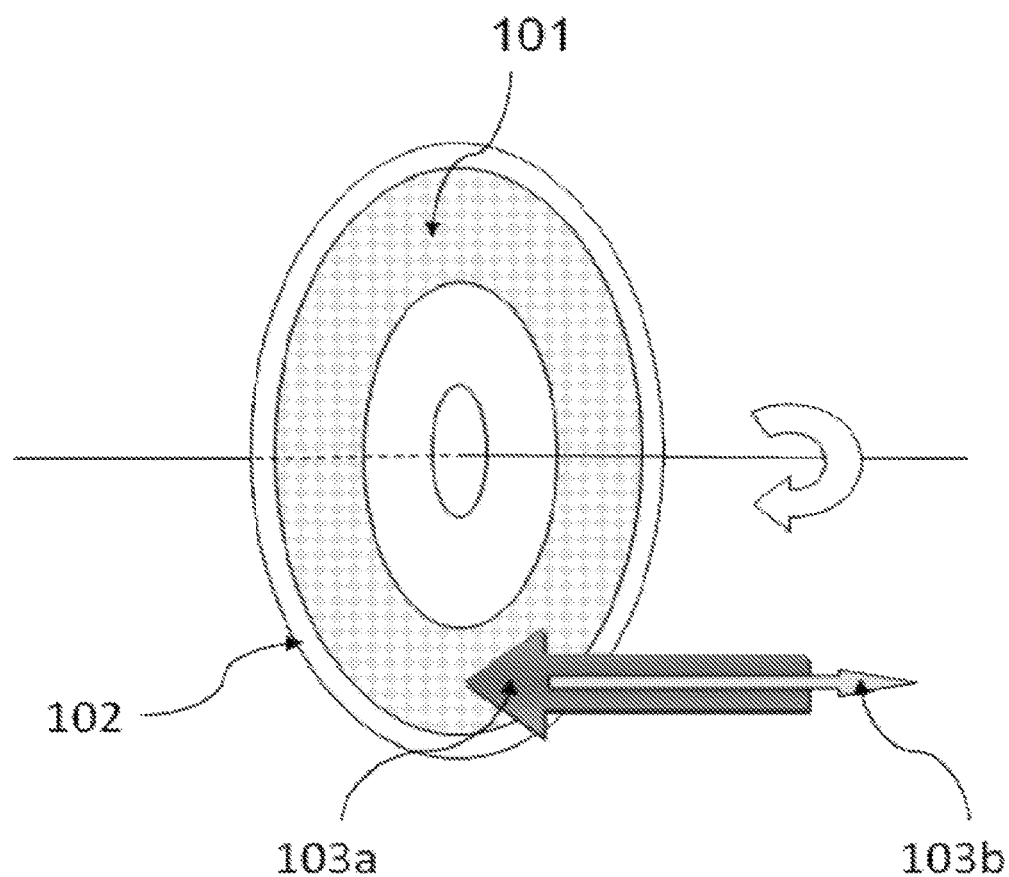
FIG. 1 shows an example, known phosphor wheel structure.
Figure 2:
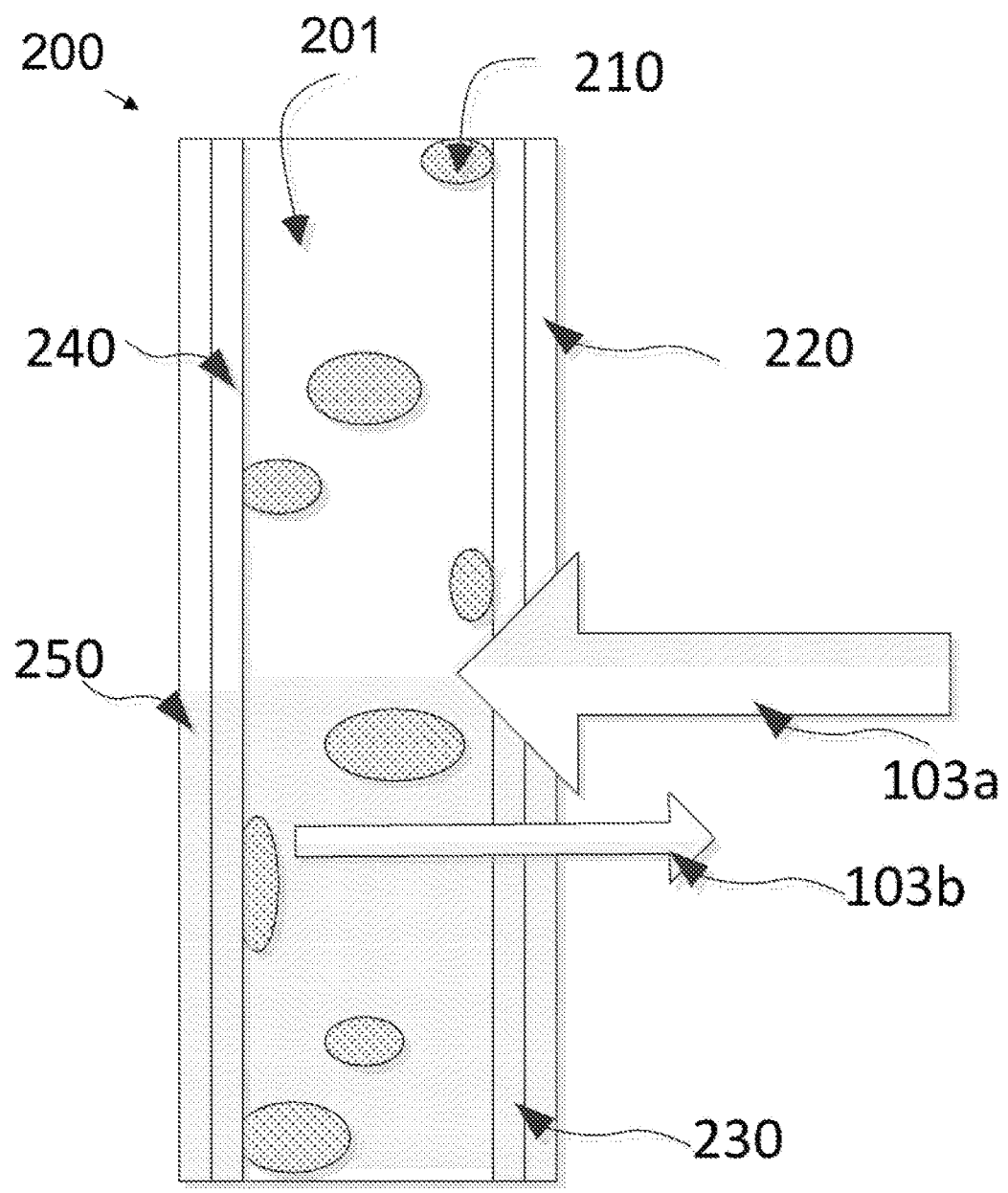
FIG. 2 schematically illustrates a cross-section view of a first embodiment in accordance with the disclosure.

Referring first to FIG. 2, there is schematically illustrated a cross-section view of a first embodiment of a light converter 200. There is shown: a ceramic light conversion material 201; a first filler layer 230; a first optical coating 220; a second filler layer 240; and a second optical coating 250.

The ceramic light conversion material 201 is typically a porous material which contains voids 210. The ceramic light conversion material 201 beneficially handles high temperature, high power of incident light and thermal quenching can advantageously be used. The thickness of the ceramic light conversion material 201 may affects its efficacy. A thickness of between 200 µm and 250 µm is currently preferred, due to the process capability of the material, but this can vary to optimize its properties, taking into account processing considerations and performance efficacy.

On the side of the ceramic light conversion material 201 facing incident excitation light 103a, the filler layer 230 is deposited on the surface, followed by a first, anti-reflective coating 220 designed for the excitation light 103a. To allow converted light to be collected from all possible directions, a second, high-reflective coating 250 for emission light 103b is additionally applied. Large angle light collection (at least 30 degrees relative a normal to the surface) is highly desirable. To minimize the porosity effect, a second filler layer 240 is coated prior to the deposition of the second, high-reflective coating 250. This second filler layer 240 has a low optical refractive index. This may allow reflection of light at large angles to the surface, particularly plus or minus 30 degrees relative a normal to the surface. This design may provide high-temperature resistance and/or improved optical performance, with at least 10% more light conversion as compared to the uncoated ceramic light conversion material 201.

The material for the filler layer 230 and/or the second filler layer 240 may depend on the material used for the light conversion material underneath, especially its refractive index. Low absorption and low refractive index are desirable properties. In particular, the refractive index of the filler material is less than that of the ceramic light conversion material 201 and preferably it is as low as possible (less than 1.3, 1.25, 1.2, 1.1 or 1.05), whilst still allowing a reliable optical film. A low refractive index may improve the TIR angle. The use of a low refractive index coating and the filler layer coating in one material, that is. unified in both functions of TIR and filler coating for achieving optical surface provides a significant advantage. For the ceramic light conversion material 201, the filler layer 230 and the second filler layer 240 comprise $SiO_2$ and/or $Al_2O_3$. The thickness of the filler layer (or layers) is made sufficient to make the filler layer or layers optically smooth, typically 400 nm to 1000 nm.

The anti-reflective coating 220 and the high-reflective coating 250 are deposited using PVD. The thickness of these coatings is based on the design performance, the thin-film materials used and the properties of the adjacent materials, such as the filler layer.

The high-reflective coating 250 works very close (typically 0-100 µm) to the light emission centers. Moreover, it desirably has a broad-band spectrum. With these issues in mind, the high-reflective coating 250 may be termed a near-field (or near-source) broad-band high-reflective coating. As the high-reflective coating 250 reflects light emitted very closed to its reflective surface, it operates in a very different from the way a normal reflector is used. Therefore, the design and the working principles of this high-reflective coating 250 are quite different too in a number of respects. Firstly, it is configured to use internal refection rather than external reflection, which may improve performance at large angles. Secondly, broad angle of reflection is provided (since the emitter is near-field to the reflection). Thirdly, the high-reflective coating 250 has a broad-band reflection spectrum (since the light converter incorporates phosphors which have broad emission spectrum).

In general terms, there is provided a light converter, comprising: a solid-state light conversion material, for generating emission light from excitation light incident on a surface of the solid-state light conversion material; a filler layer on the surface of the solid-state light conversion material; and at least one optical coating on the filler layer. Additionally or alternatively, a method of manufacturing a light converter may comprise: depositing a filler layer on a surface of a solid-state light conversion material, the solid-state light conversion material generating emission light from excitation light incident on the surface; and applying at least one optical coating to the filler layer. This method may have any optional features corresponding with those of the light converter.

There are no specific dimensions for the solid-state light conversion material, although typically it will have at least two (distinct) surfaces. The filler layer and/or optical coating may be one or multiple surfaces of the solid-state light conversion material. Excitation light from a light source may be incident on the light converter, specifically on the optical coating. Excitation light, generated by the solid-state light conversion material may then emerge from the light converter.

Figure 3:
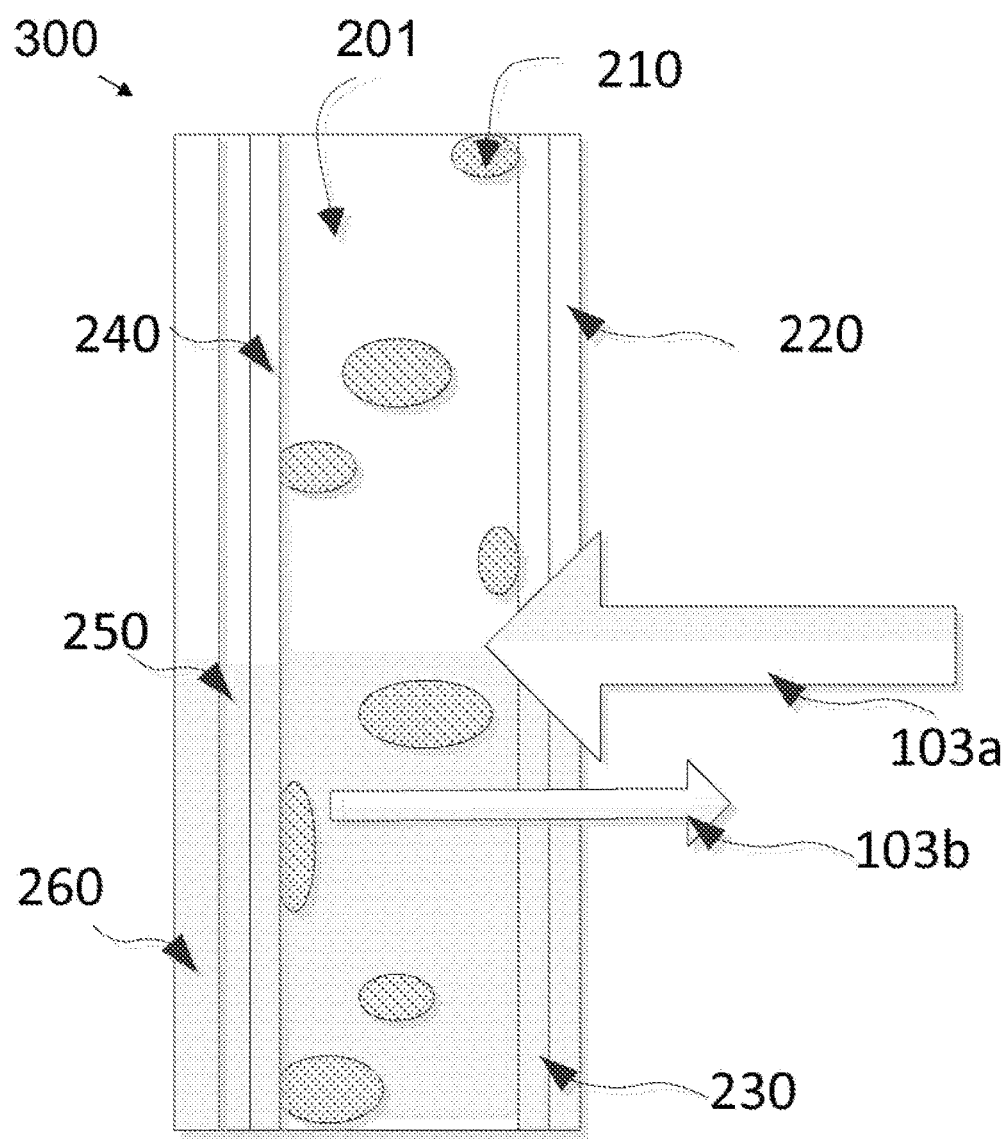
FIG. 3 depicts a schematic of a cross-section view of a second embodiment in accordance with the disclosure.

Referring next to FIG. 3, there is depicted a schematic of a cross-section view of a second embodiment of a light converter 300. The light converter 300 is similar to the embodiment of FIG. 2 and where the same features are shown, identical reference numerals have been employed. For the sake of brevity, the features common to FIG. 2 will not be described.

In this embodiment a metallic coating 260, such as AlFlex™ or SilFlex™ is additionally deposited on top of the high-reflective coating 250. The metallic coating 260 may be reflective, to act as a mirror. The metallic coating 260 typically reduces leak of emission light at large angle to the converter surface. In this case, the second filler layer 240 need not have a low optical refractive index. The metallic coating 260 may improve thermal management and in particular, increase the thermal dissipation from the excitation light spot to an attached heat sink, as will be explained below. In general terms, it may be seen that the metallic mirror coating 260, on the reverse side of the light convertor opposite to the incident excitation light, can provide a thermal dissipation function (as it is, by itself, a metal-based coating which has relatively high thermal conductivity) and/or a reflective function. The combination of the two is highly advantageous.

Figure 4:
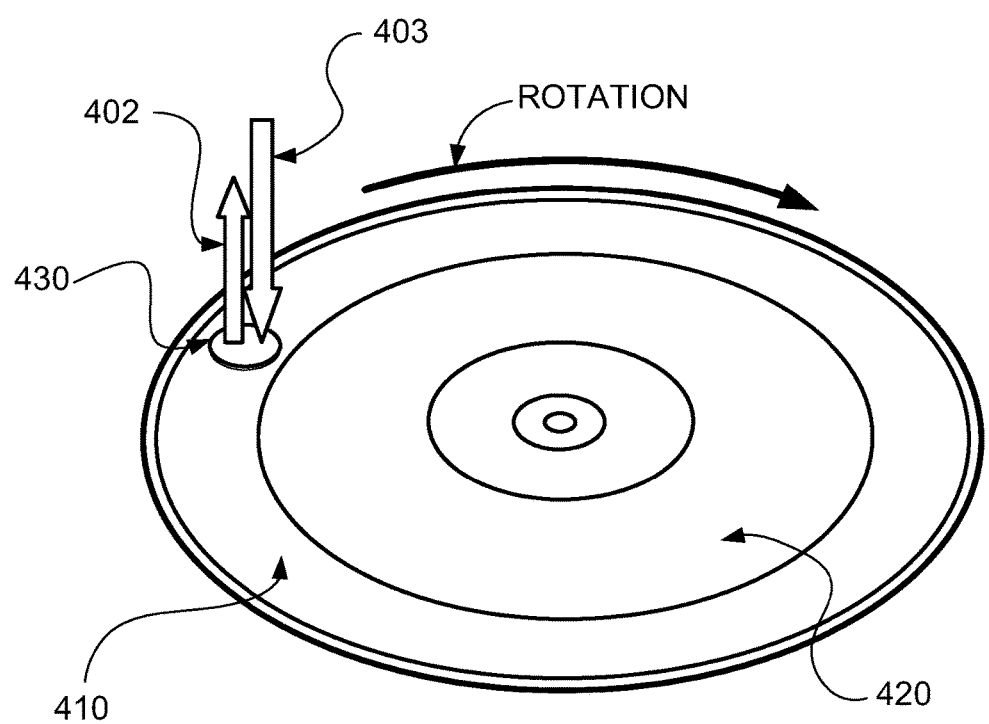
FIG. 4 shows a light converter in line with the disclosure, bonded to a wheel substrate.

Referring now to FIG. 4, there is shown a light converter bonded to a disc or wheel substrate. This may be considered a phosphor wheel embodiment. There is shown: a light converter 410; and a disc or wheel substrate 420. Not all of the details of the light converter 410 are shown, but the design of the light converter 410 is closer to that of the light converter 300 detailed in FIG. 3 (or an alternative based on the structure proposed in the drawing may be used).

A metallic mirror coating (not shown) integrated on the light converter 410 is bonded to the wheel substrate 420, which serves also as a heat sink. The heat dissipation from the incident spot of the excitation light 403 is increased and the temperature of a light spot area 430 on the light converter 410 is thereby decreased. Improved converted emission light 402 is provided as a result.

Although specific embodiments have been described, the skilled person will understand that variations and modifications are possible. For example, the designs may be applicable to all solid-state light converters and not necessarily only those using a ceramic material, for example a glass-based or plastics-based material may be used. The glass-based or plastics-based material may act as a substrate that is coated with a phosphor. The benefits may be more pronounced for more porous materials. Beneficially, solid-state light converters do not require a polymer binder, which can improve the working temperature and eliminate degradation. Different configurations of coatings may be applied to the solid-state light converter from those described above, especially in terms of their type, number and order. Also, only one side or surface of the solid-state light converter may be coated. Alternatively, a plurality of different surfaces from those shown herein may be coated. The filler material may not have a low refractive index and instead, a low refractive index may be applied to it, to effect TIR.

Different manufacturing processes may be used, for example without cleaning the ceramic light conversion material 201 surfaces or surfaces, especially when the surfaces are fresh. The high-reflective coating 250 may have only some or none of the specific differentiating properties identified above. The material and manufacturing process for the filler layer or layers may be changed. For example, other materials may be used in line with the considerations identified above. Additionally or alternatively, Sol-gel/dip coating, CVD, magneto sputtering PVD (which may provide good film density) or other techniques may be used for depositing the filler layer or layers. In some embodiments, an additional broad-band reflector, such an Ag, Al or Au coating may be provided. Other techniques may be used for depositing the anti-reflective coating 220 and/or high-reflective coating 250, for example dip coating for the anti-reflective coating 220.

Whilst FIG. 4 relates specifically to a design based on the embodiment of FIG. 3, the skilled person will understand that the design of FIG. 2 (or any other design based on that proposed herein) may also be attached to a substrate. FIG. 4 shows a disc substrate, but it will be appreciated that other types, shapes and sizes of substrate may be used, especially for different applications. Possible applications may include: a colour wheel; a phosphor wheel (for use in a projection display, for instance); and an automotive headlight.

The invention claimed is:

1. A light converter, comprising:
a solid-state wavelength conversion material, for generating emission light from excitation light incident on a first surface of the solid-state light conversion material;
a first filler layer on the first surface of the solid-state light conversion material, wherein the first filler layer has an optical refractive index that is lower than that of the solid-state wavelength conversion material; and
at least one first optical coating on the first filler layer;
a second filler layer on a second surface of the solid-state light conversion material that is opposite the first surface; and
at least one second optical coating on the second filler layer.

2. The light converter of claim 1, wherein the first filler layer is configured to be optically smooth.

3. The light converter of claim 1, wherein the solid-state wavelength conversion material is porous.

4. The light converter of claim 1, wherein the solid-state wavelength conversion material comprises a ceramic material.

5. The light converter claim 1, wherein the at least one first optical coating is a thin film coating.

6. The light converter of claim 1, wherein the at least one first optical coating comprises one or more of: an anti-reflective coating; a high-reflective coating; a metallic coating.

7. The light converter of claim 6, wherein the at least one first optical coating comprises: a first coating; and a metallic coating on the first coating, arranged to reduce leak of emission light at a large angle to the surface of the solid-state wavelength conversion material.

8. An optical device, comprising:
a substrate; and
a light converter in accordance with claim 1, on the substrate.

9. The optical device of claim 8, wherein the at least one first optical coating of the light converter comprises a metallic coating, the metallic coating being bonded to the substrate.

10. The optical device of claim 9, wherein the optical device is one of: a colour wheel; a phosphor wheel; a projection display; and an automotive headlight.

11. The light converter of claim 1, wherein the first filler layer has a thickness in the range 400 nm to 1000 nm and the second filler layer has a thickness in the range 400 nm to 1000 nm.

12. A method of manufacturing a light converter, comprising:
depositing a first filler layer on a first surface of a solid-state wavelength conversion material, the solid-state wavelength conversion material generating emission light from excitation light incident on the first surface, wherein the first filler layer has an optical refractive index that is lower than that of the solid-state wavelength conversion material;
applying at least one first optical coating to the filler layer;
depositing a second filler layer on a second surface of the solid-state wavelength conversion material that is opposite the first surface; and
applying at least one second optical coating to the second filler layer.

13. A light converter, comprising:
a solid-state wavelength conversion material, for generating emission light from excitation light incident on a first surface of the solid-state light conversion material, wherein the solid-state wavelength conversion material comprises a ceramic material and is porous;
a first filler layer on the first surface of the solid-state light conversion material, wherein the first filler layer has an optical refractive index that is lower than that of the solid-state wavelength conversion material; and
at least one first optical coating on the first filler layer;
a second filler layer on a second surface of the solid-state light conversion material that is opposite the first surface; and
at least one second optical coating on the second filler layer.

14. The light converter of claim 13, wherein the first filler layer has a thickness in the range 400 nm to 1000 nm and the second filler layer has a thickness in the range 400 nm to 1000 nm.

\* \* \* \* \*